United States Patent
Jovenin et al.

(10) Patent No.: US 6,529,720 B1
(45) Date of Patent: Mar. 4, 2003

(54) INTEGRATED CIRCUIT OF INDUCTIVE ELEMENTS

(75) Inventors: Fabrice Jovenin, Caen (FR); Sever Cercelaru, Caen (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/467,597

(22) Filed: Dec. 20, 1999

(30) Foreign Application Priority Data

Dec. 29, 1998 (FR) .............................. 98 16569

(51) Int. Cl.[7] .............................. H04B 1/26
(52) U.S. Cl. ................... 455/318; 455/333; 257/531; 331/117 R
(58) Field of Search ................ 455/318, 319, 455/323, 333; 257/531, 532; 331/117 R, 177 R, 177 V

(56) References Cited

U.S. PATENT DOCUMENTS

| | | | |
|---|---|---|---|
| 5,070,317 A | 12/1991 | Bhagat | 336/200 |
| 5,173,671 A | 12/1992 | Wendler et al. | 333/185 |
| 5,370,766 A | 12/1994 | Desaigoudar et al. | 156/643 |
| 5,959,522 A * | 9/1999 | Andrews | 336/200 |
| 6,268,778 B1 * | 7/2001 | Mucke et al. | 331/117 R |

FOREIGN PATENT DOCUMENTS

| | | | |
|---|---|---|---|
| EP | 0836271 A1 | 4/1998 | H03B/5/12 |
| WO | WO9850956 | 11/1998 | H01L/20/00 |

* cited by examiner

*Primary Examiner*—Lee Nguyen
(74) *Attorney, Agent, or Firm*—Dicran Halajian

(57) ABSTRACT

An integrated circuit includes at least an inductive element and an active region which may include resistive, capacitive and semiconductor elements. The inductive element and part of the active region are superimposed. The integrated circuit has a screen for insulating the active region with respect to an electromagnetic field that the inductive element develops. The screen allows the implementation of inductive elements having high quality factors in integrated circuits of reduced size and in which the electromagnetic interactions between the inductive elements and the other elements are reduced.

8 Claims, 5 Drawing Sheets

INTEGRATED CIRCUIT OF INDUCTIVE ELEMENTS

FIELD OF THE INVENTION

The invention relates to an integrated circuit comprising at least an inductive element, and a region called active region which may include resistive, capacitive and semiconductor elements, while the inductive element and part of the active region are superimposed.

BACKGROUND OF THE INVENTION

A method for fabrication of such an integrated circuit is mentioned in U.S. Pat. No. 5,370,766. The object of this method is to reduce the total surface of the integrated circuit.

The invention is linked with the following considerations:

The superpositioning of an inductive element and the active region may cause the appearance of mutual inductances and parasitic couplings between the inductive element and the elements of the active region, which leads to a considerable deterioration of the quality factor of the inductive element and to a reduction of the precision of the frequency of the circuit.

A solution already known for minimizing the problems of interaction between the inductive element and the elements of the active region comprises putting the inductive element separate from other elements. Such an integration then poses a problem of bulkiness. Actually, to realize them, the inductive elements may require a quarter of the total surface of the circuit.

SUMMARY OF THE INVENTION

It is an object of the invention to largely remedy these drawbacks by proposing an integrated circuit in which at least an inductive element and an active region exist together between which the electromagnetic interactions are reduced without the bulkiness of the integrated circuit being increased significantly.

It is another object of the present invention to allow the integration of a compact integrated circuit which comprises at least an inductive element that presents a high quality factor.

Indeed, an integrated circuit in accordance with the opening paragraph is characterized according to the invention in that it comprises screening means for insulating the active region from an electromagnetic field that the inductive element is intended to develop.

In such an integrated circuit, the electromagnetic field which may be created by the inductive element is largely blocked by the screening means and its interaction with the elements of the active region is limited.

In an embodiment of the invention the screening means are placed between the inductive element and the active region and form an open circuit.

The object of this embodiment of the invention is to prevent screening means developing a mutual inductance with the inductive element. In this embodiment the screening means forming an open circuit cannot be passed through by a current induced by the magnetic field generated by the inductive element. Consequently, the mutual inductance existing between these screening means and the inductive element is very small.

In an advantageous embodiment of the invention, the screening means comprise a plate of low-resistive material placed perpendicularly to the vectors of the magnetic field intended to be developed by the inductive element, and formed by an alternation of bands and slots perpendicular to a current that could be induced in the plate by the inductive element, the bands being connected to an open frame.

Because of these characteristic features, such a plate blocks the propagation of an electric field to the active region of the circuit and functions as an open circuit with respect to a current that could be induced there. The mutual inductance that could be generated with the inductive element is thus nearly zero.

In a preferred embodiment of the invention, the screening means further include a via hole of low-resistance material whose walls surround the inductive element completely, said via hole having at least one slot over its entire height.

The inductive element, when positioned in the neighborhood of another inductive element, creates a mutual inductance with this other inductive element. This mutual inductance has a tendency to deteriorate the quality factor of the inductive element. The via hole enables to limit the creation of such mutual inductance by limiting the magnetic interaction of the inductive element with any other inductive element present in the circuit. A slot is provided over the entire height of the via hole so as to prevent the formation of a current loop at the surface of the via hole.

In an advantageous embodiment of the invention, the plate and the via hole are together connected to a reference terminal having potential. It is an object of the invention to limit the capacitive couplings between the elements of the circuit. By connecting the via hole and the plate to each other and to a same potential, limited parasitic capacitances will be created between the various elements of the circuit.

As the integrated circuit is basically formed by a superposition of layers, each made of a low-resistance material, the walls of the via hole are formed by a stacking of tracks, each cut out in one of said layers around a perimeter defined by the surface of the inductive element, while said tracks are interconnected. This embodiment of the invention is simple and cost-saving. The implementation of the via hole by the use of existing layers does not increase the size of the circuit.

In a particular embodiment of the invention, the integrated circuit comprises two inductive elements, the two being connected between a supply terminal and a reference terminal having potential, and each formed by a turn, said turns having symmetrical and opposite directions of coil winding, the respective parts of said facing turns being those that are farthest away from the power supply terminal. The choice of the directions of the coil windings influences the value of the mutual inductance which is formed when a current passes through the windings and, consequently, influences the value of the quality factor. This choice is made so as to optimize the quality factor of the inductive element.

Each inductive element will advantageously be surrounded by a via hole as described above so as to maximize the reduction of the electromagnetic interactions among said elements.

The present invention may be utilized in any integrated circuit in which an inductive element exists side by side with other elements, whether they are capacitive, resistive or semiconductor elements. The integrated circuit may, for example, be an oscillator, an active charge mixer, or a filter. In one of its applications, the invention therefore also relates to an oscillator intended to deliver an output signal that has a frequency whose value depends on the value of a tuning voltage, characterized in that the oscillator is realized in the form of an integrated circuit in accordance with the invention, of which the active region includes at least a varicap diode connected to the inductive element and intended to be biased by means of the tuning voltage.

More generally, the present invention may advantageously be used in an apparatus for receiving radio signals. The invention therefore relates to a radio signal receiving apparatus comprising:

- an antenna and filter system enabling to receive a radio signal whose frequency, called radio frequency, is selected within a given frequency range, and its transformation into an electronic signal called radio signal,
- a local oscillator whose frequency called oscillation frequency can be tuned as a function of a tuning voltage, and
- a mixer, intended to receive the radio signal and a signal coming from the local oscillator and to deliver an output signal having a fixed frequency and equal to the difference between the radio frequency and the oscillation frequency, and
- a signal processing unit intended to use the output signal of the mixer, which apparatus is characterized in that the local oscillator is in accordance with the oscillator described earlier.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF PREFERRED EMBODIMENTS

Figure 1:
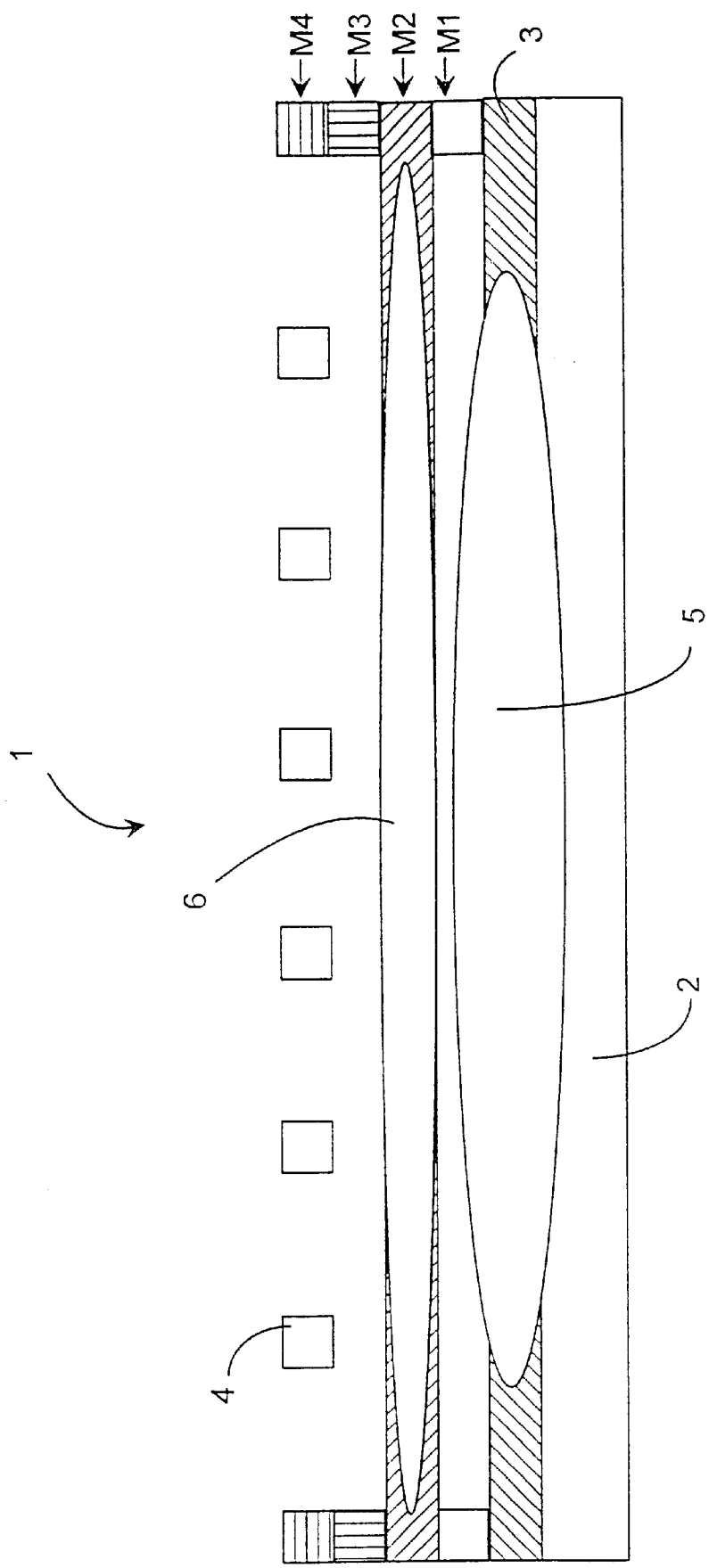
FIG. 1 is a cross-sectional view of an integrated circuit in accordance with an embodiment of the invention.

FIG. 1 is a cross-sectional view of a particular embodiment of an integrated circuit in accordance with the present invention. The circuit 1 is formed by a substrate 2 which may be connected to a reference terminal having potential and on which are superimposed a first, a second, a third, a fourth and a fifth layer of low-resistance material (3, M1, M2, M3 and M4). The substrate 2 made of polysilicon, the first layer 3, also made of polysilicon, and the second layer M1 formed by a metallic alloy enable to realize an active region 5 of the circuit which comprises active, passive and semiconductor elements. In the integrated circuit described here, an inductive element 4 is realized in the material that forms the fifth layer M4 of the circuit, so that said inductive element 4 and part of the active region 5 are superimposed. Screening means 6 are provided for insulating the active region 5 with respect to an electromagnetic field that is intended to be developed by the inductive element 4. The screening means 6 are realized on a layer, the third layer M2 in this example, placed between the second layer M1 and the fifth layer M4, while these screening means 6 are disposed perpendicularly to the vectors of the magnetic field developed by the inductive element 4.

In the embodiment described here, the screening means 6 are not in contact with the inductive element 4. The fifth layer M4 with which the inductive element 4 is incorporated, and the third layer M2 with which the screening means 6 are incorporated, are actually separated by the thickness of the fourth layer M3. The inductive element 4 and said screening means 6 considered together may form an L-C element. A capacitor C formed between the inductive element 4 and said screening means 6 degrades the quality factor of the inductive element. The value of this capacitor is a function of the distance separating the screening means from the inductive element. For minimizing this value, said screening means are at a distance from the inductive element.

This quality factor will be further improved if the screening means are made of a low-resistance material, as is the case in this example.

Figure 2:
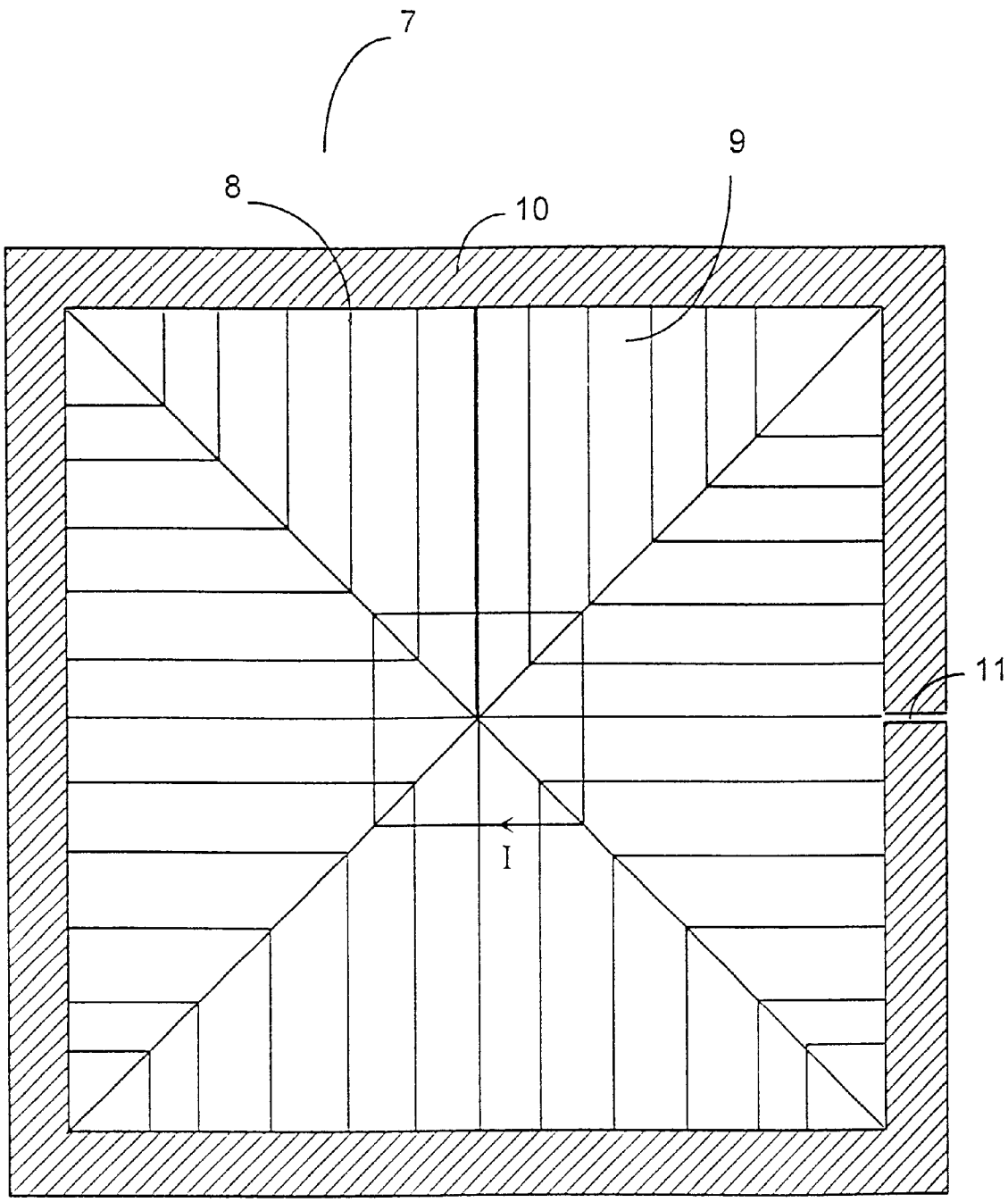
FIG. 2 is a plan view of a plate included in an integrated circuit in accordance with an advantageous embodiment of the invention.

FIG. 2 shows a preferred embodiment of the screening means 6 described previously. These screening means 6 comprise a plate of low-resistance material, placed perpendicularly to the vectors of the magnetic field developed by the inductive element 4, and formed by an alternation of bands 8 and slots 9. The bands 8 are made, for example, of a metallic alloy or of polysilicon. As a plate is arranged perpendicularly to the vectors of the magnetic field developed by the inductive element, an induced current I could appear in the plate if the plate were made in one piece. The alternation of slots 9 and bands 8 arranged perpendicularly to this current I forms an open circuit preventing the flowing of this induced current. As this current is nearly zero in the screening means, the mutual inductance that may appear between these screening means and the inductive element is also nearly zero. This makes it possible to not degrade the quality factor of the inductive element. To be kept in place, the bands are attached on the outside to a frame 10 which is not closed. A slot 11 in the frame 10 prevents the formation of a current loop on the frame.

In a particular embodiment of the invention, the assembly 7, formed by the association of the frame 10 and the bands 8, is connected to a reference terminal having potential or ground. For a symmetrical circuit, the virtual ground of the circuit is chosen. The integrated circuit will most often comprise a substrate connected to the reference terminal. The quality factor of the inductive element is a function of the value of a first parasitic capacitance that may appear between the plate and the inductive element and of the value of the second capacitance that may appear between the plate and the substrate. The connection of the plate to the reference terminal enables to limit the first parasitic capacitance. Moreover, the fact that the plate is put at the same potential as a substrate makes it possible to prevent the formation of the second parasitic capacitance, and the quality factor of the inductive element is not degraded.

Besides, the connection of the plate and the substrate 2 to the same reference potential prevents the transmission of an electric field between the plate and the substrate and thus to the elements of the active region. The magnetic field that may be developed by the inductive element in active region 5 is attenuated considerably by the plate.

Figure 3:
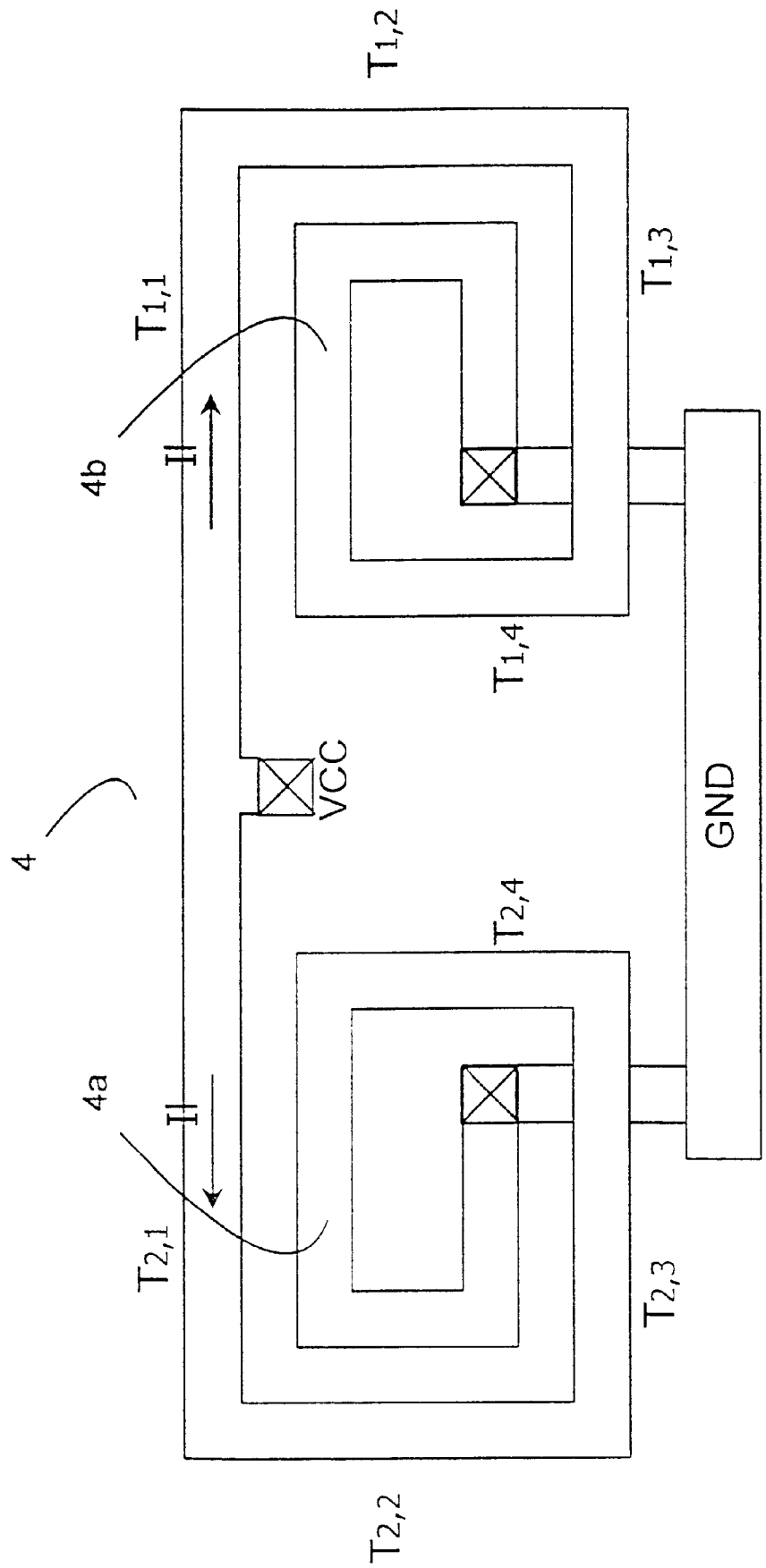
FIG. 3 is a plan view of two inductive elements present in a circuit in accordance with the invention.

FIG. 3 is a plan view of two inductive elements of an integrated circuit in accordance with a particular embodiment of the invention. These two inductive elements 4a, 4b, comprising each a square turn {T1,1, T1,2, T1,3, T1,4} and {T2,1, T2,2, T2,3, T2,4}, are symmetrical and placed beside one another. They are both connected between a supply terminal VCC and a reference terminal having potential GND. A current I1 runs through them from the supply terminal to the reference terminal having potential. This embodiment enables to minimize the mutual inductances that may appear in the circuit and which degrade the quality factor of the inductive element and, consequently, the performance of the circuit. Each turn {T1,1, T1,2, T1,3, T1,4} and {T2,1, T2,2, T2,3, T2,4} acts as an assembly of four inductors in series, each inductor corresponding to one part of the turn. The mutual inductance between two neighboring turns depends on the choice of the directions in which the turns are wound. The choice of the directions of winding is made so that those parts of said turns that are directly opposite each other are those that are farthest away from the supply terminal. Parts of the turns placed opposite each other create a mutual inductance that is higher as the parts are nearer to the supply terminal. The directions of winding chosen here for the turns of the inductive elements 4a, 4b enable to reduce the mutual inductance, because the coupling is only made to the fourth part of each turn T1,4 and T2,4.

Figure 4:
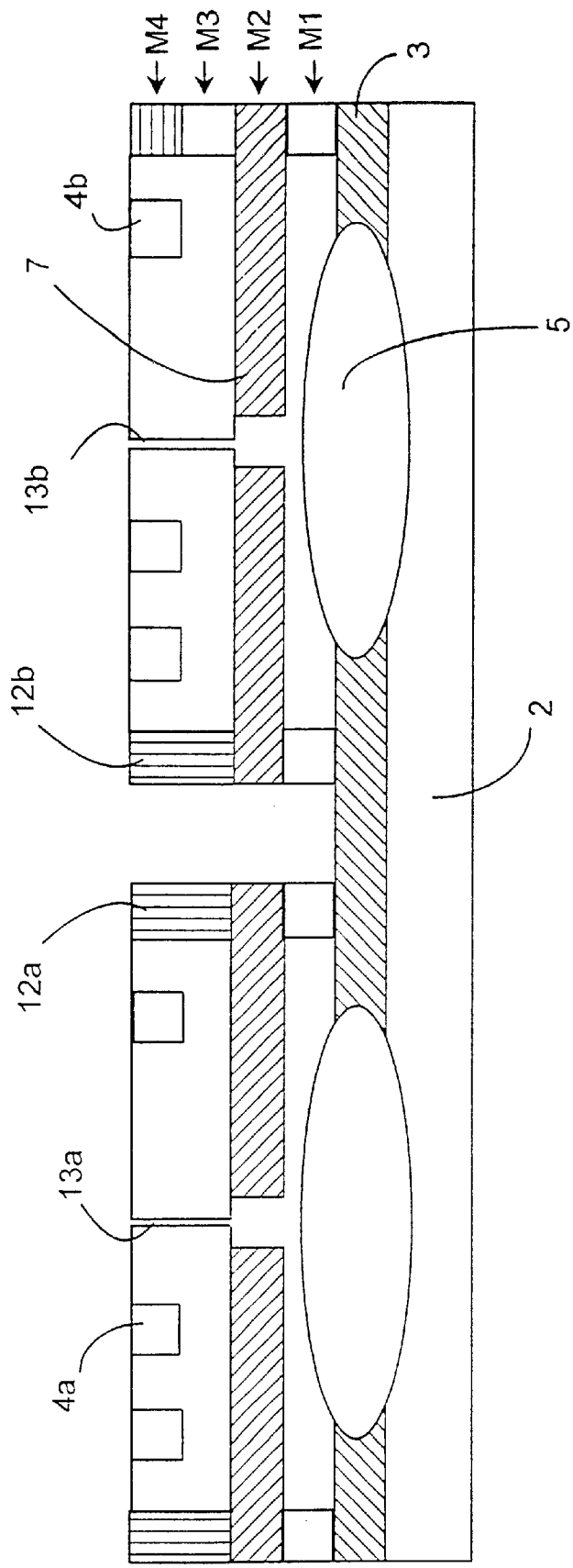
FIG. 4 is a cross-sectional view of an integrated circuit in accordance with a preferred embodiment of the invention.

FIG. 4 is a cross-sectional view of an integrated circuit in accordance with a preferred embodiment of the invention. This integrated circuit comprises two inductive elements 4a, 4b such as the two inductive elements described in the preceding paragraph. Two via holes 12a and 12b are formed around inductive elements 4a and 4b. Each via hole 12a, 12b realized here of a conductive material has a square base and its walls completely surround one of the inductive elements 4a, 4b. Each via hole 12a, 12b has over its entire height a slot 13a, 13b which interrupts any possible circulation of a current induced by the inductive element 4a, 4b it surrounds. These via holes 12a, 12b enable to minimize the mutual inductances between the two inductive elements 4a, 4b. In the embodiment described here, each via hole 12a, 12b is realized by junctions of parts of the layers M3 and M4. These via holes are sufficiently high to ensure a proper insulation between the inductive elements 4a and 4b and limit the magnetic interaction between these inductive elements. In general manner, each inductive element or part of an inductive element included in the integrated circuit may be insulated by screening means which comprise such a via hole, so that the mutual inductances that may be developed between this inductive element or part of an inductive element and other elements present in the circuit are minimized.

In a preferred embodiment of the invention, the plate and the via hole are together connected to a reference terminal having potential. The parasitic capacitive couplings between the plate and the substrate on the one hand, between the plate and the inductive element on the other and, finally, between the plate and the via hole, are accordingly limited considerably. The inductive element included in the integrated circuit of this preferred embodiment of the invention will then present a high quality factor.

Figure 5:
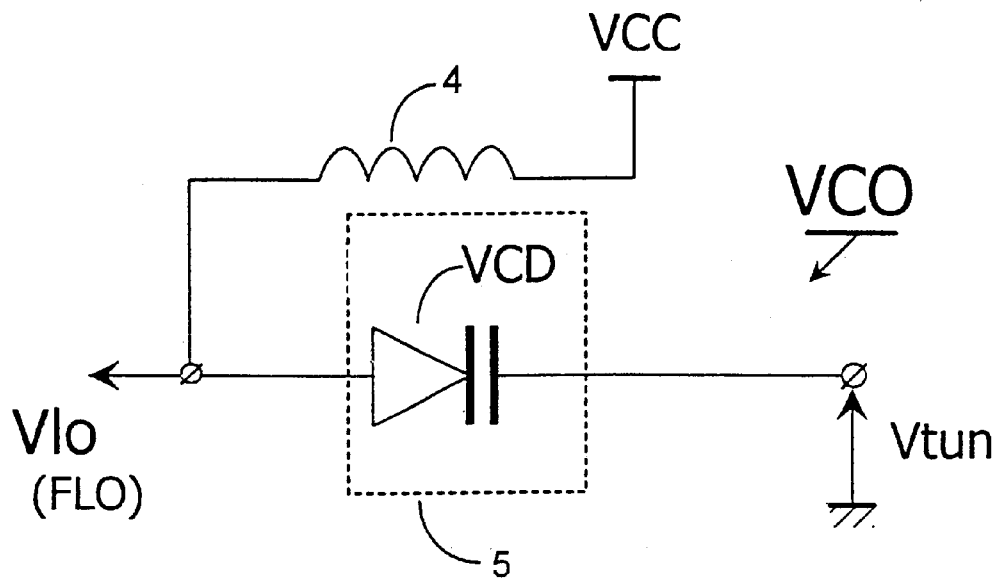
FIG. 5 is a functional diagram of an oscillator of which the realization is in accordance with the invention.

FIG. 5 is a functional diagram of an oscillator realized in the form of an integrated circuit according to the invention. This oscillator VCO is intended to produce a voltage signal Vlo having a frequency FLO whose value depends on a tuning voltage Vtun. This oscillator comprises an inductive element 4 connected to a supply terminal VCC, and an active region 5 comprising a varicap diode VCD. The diode VCD is biased by means of the tuning voltage Vtun.

Figure 6:
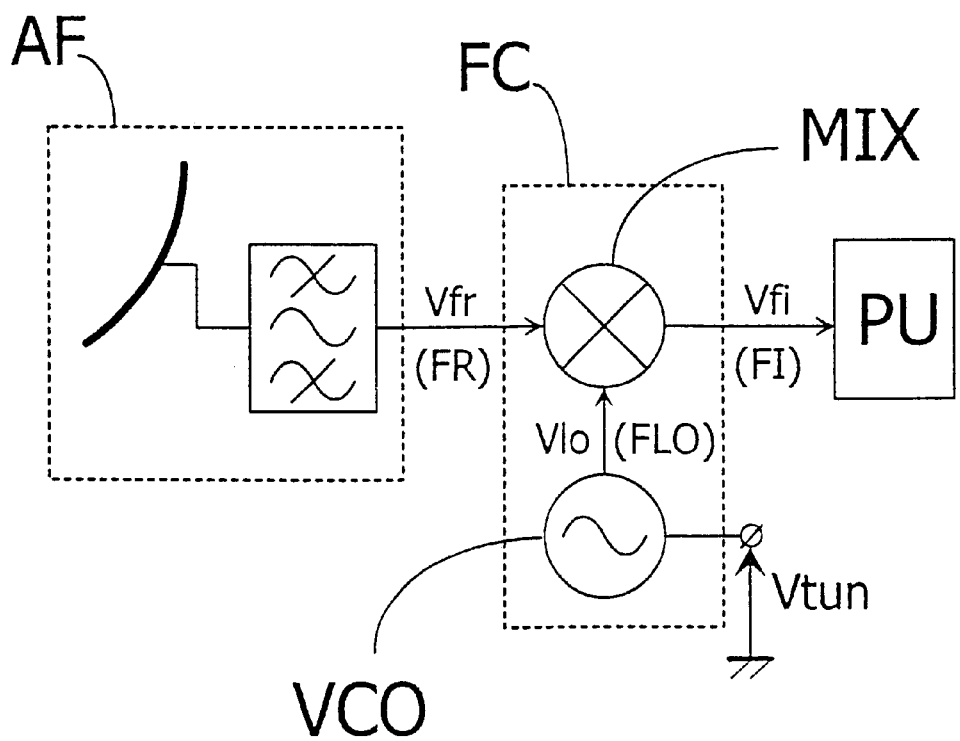
FIG. 6 is a functional diagram of a radio signal receiving apparatus comprising an oscillator in accordance with the invention.

FIG. 6 diagrammatically shows an apparatus for receiving radio signals, comprising an antenna and filter system AF, enabling the reception of a radio signal whose frequency FR, called radio frequency, is selected within a given range of frequencies, and its transformation into an electronic signal Vfr. This receiving apparatus further includes a frequency converter FC which includes a local oscillator VCO and a mixer MIX which is intended to receive the radio signal Vfr and a signal Vlo coming from the local oscillator VCO of which the frequency FLO, called oscillation frequency, can be tuned, and intended to deliver an output signal Vfi having a frequency FI which is fixed and equal to the difference between the radio frequency FR and the oscillation frequency FLO.

In this frequency converter FC, the choice of the value of the oscillation frequency FLO, made by means of a tuning voltage Vtun, imposes the value of the radio frequency FR, because the intermediate frequency FI is rendered fixed, for example, by means of a filter system (not shown in the Figure) that would be arranged at the output of the mixer MIX. This receiving apparatus finally includes a signal processing unit PU intended to make use of the output signal of the mixer MIX.

What is claimed is:

1. An integrated circuit comprising at least an inductive element, an active region which may include resistive, capacitive and semiconductor elements, and screening means for insulating the active region from an electromagnetic field that the inductive element develops, wherein the screening means comprise a plate of low-resistive material placed perpendicularly to the vectors of the magnetic field intended to be developed by the inductive element, and formed by an alternation of bands and slots perpendicular to a current that could be induced in the plate by the inductive element, the bands being connected to an open frame, the screening means further including a via hole of low-resistance material whose walls surround the inductive element completely, said via hole having at least one slot over its entire height.

2. An integrated circuit as claimed in claim 1, wherein the screening means are placed between the inductive element and the active region and form an open circuit.

3. An integrated circuit as claimed in claim 1, wherein the plate and the via hole are together connected to a reference terminal having potential.

4. An integrated circuit as claimed in claim 1, wherein the walls of the via hole are formed by a stacking of tracks, each cut out in one of layers around a parimeter defined by the surface of the inductive element, while said tracks are interconnected parimeter.

5. An integrated circuit as claimed in claim 1, wherein the integrated circuit comprises two inductive elements, the two being connected between a supply terminal and a reference terminal having potential, and each formed by a turn, said turns having symmetrical and opposite directions of coil winding, the respective parts of said turns being those that are farthest away from the power supply terminal.

6. An oscillator intended to deliver an output signal that has its frequency whose value depends on the value of a tuning voltage, wherein the oscillator is realized in the form of an integrated circuit as claimed in claim 1, of which the active region includes at least a varicap diode connected to the inductive element and intended to be biased by means of the tuning voltage.

7. An apparatus for receiving radio signals comprising:
an antenna and filter system enabling to receive a radio signal whose radio frequency is selected within a given frequency range, and its transformation into a radio signal, a local oscillator whose oscillation frequency is tunable as a function of a tuning voltage, and a mixer which receives the radio signal and a signal coming from the local oscillator and delivers an output signal having a fixed frequency and equal to the difference between the radio frequency and the oscillation frequency, and a signal processing unit which uses the output signal of the mixer, wherein the local oscillator is in accordance with the oscillator of claim 6.

8. An integrated circuit comprising:

at least an inductive element, an active region; and a screen layer between said active region and said at least inductive element, said screen layer insulating the active region from a magnetic field that said at least inductive element develops;

wherein the screen layer comprises an open frame and a plate of low-resistive material placed perpendicularly to vectors of the magnetic field developed by said at least inductive element, said plate comprising an alternation of bands and slots perpendicular to a current that is induceable in the plate by said at least inductive element, wherein the bands are connected to said open frame, the screen layer further including a via hole having walls that surround said at least inductive element, said via hole having at least one slot over its entire height.

* * * * *